(12) United States Patent
Cotte et al.

(10) Patent No.: US 6,890,855 B2
(45) Date of Patent: May 10, 2005

(54) PROCESS OF REMOVING RESIDUE MATERIAL FROM A PRECISION SURFACE

(75) Inventors: John Michael Cotte, New Fairfield, CT (US); Kenneth John McCullough, Fishkill, NY (US); Wayne Martin Moreau, Wappinger, NY (US); Keith R. Pope, Danbury, CT (US); John P. Simons, Wappingers Falls, NY (US); Charles J. Taft, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 25 days.

(21) Appl. No.: 09/893,207

(22) Filed: Jun. 27, 2001

(65) Prior Publication Data

US 2003/0003762 A1 Jan. 2, 2003

(51) Int. Cl.$^7$ ............................................. H01L 21/302
(52) U.S. Cl. ...................... 438/689; 438/712; 438/745
(58) Field of Search ................................. 438/689, 712, 438/745

(56) References Cited

U.S. PATENT DOCUMENTS

| | | | |
|---|---|---|---|
| 4,506,092 A | | 3/1985 | Lentz et al. |
| 4,678,737 A | * | 7/1987 | Schneller et al. ............ 430/270 |
| 5,738,082 A | | 4/1998 | Page et al. |
| 5,868,916 A | * | 2/1999 | Moulton |
| 5,897,349 A | * | 4/1999 | Agnello ........................ 438/230 |
| 5,904,570 A | * | 5/1999 | Chen et al. ................... 438/725 |
| 5,908,510 A | | 6/1999 | McCullough et al. |
| 5,925,501 A | | 7/1999 | Zhang et al. |
| 5,976,264 A | | 11/1999 | McCullough et al. |
| 5,980,770 A | | 11/1999 | Ramachandran et al. |
| 5,981,454 A | | 11/1999 | Small |
| 6,056,895 A | * | 5/2000 | Kirsch et al. ............ 252/299.63 |
| 6,316,057 B1 | * | 11/2001 | Hirayama et al. ............ 427/400 |
| 6,331,487 B2 | * | 12/2001 | Koxh ............................ 438/692 |
| 6,355,153 B1 | * | 3/2002 | Uzoh et al. ..................... 205/87 |
| 6,387,859 B1 | * | 5/2002 | Ho ................................ 510/175 |
| 6,451,926 B1 | * | 9/2002 | Kuo et al. ..................... 525/403 |
| 6,500,605 B1 | * | 12/2002 | Mullee et al. ................ 430/329 |

OTHER PUBLICATIONS

Kirby et al., Chem Rev, 99, 565–602 (1999).
Moreau, Semiconductor Lithography, 647, Plenum Press, 1988.
Alm, Modern Coating, Oct., 1980.
Alm, J. Coating Tech, 53, No. 683, 45–50 No. 683, 45–50, Dec. 1981.

* cited by examiner

*Primary Examiner*—Amir Zaradian
*Assistant Examiner*—Pamela E Perkins
(74) *Attorney, Agent, or Firm*—Scully, Scott, Murphy & Presser; Daniel P. Morris, Esq.

(57) ABSTRACT

A process of removing residue from an etched precision surface. In this process the etched precision surface is contacted with a composition which includes liquid or supercritical carbon dioxide and a fluoride-generating species.

20 Claims, 1 Drawing Sheet

PROCESS OF REMOVING RESIDUE MATERIAL FROM A PRECISION SURFACE

BACKGROUND OF THE DISCLOSURE

1. Field of the Invention

The present invention is directed to a process of removing residue from a precision surface. More specifically, the present invention is directed to the removal of residue material from a precision surface which has been subjected to an etching process, such as reactive ion etching (RIE), by exposing the precision surface to a composition which comprises liquid or supercritical carbon dioxide and a fluoride generating species.

2. Background of the Prior Art

Semiconductor manufacture involves etching of surfaces of metals and glass-like insulators protected by a photoresist surface in order to define electrical circuitry on the semiconductor device. The photoresist material is thereupon stripped from the surface in an oxygen plasma. This processing leaves residues that must be removed by chemicals and/or solvents in order to achieve high yield.

An example of the above procedure is the etching of aluminum to define wiring on a semiconductor wafer. Despite cleaning and rinsing of the semiconductor wafer, unwanted residue remains on the top and the side walls of the metal lines. This unwanted residue includes several elements including carbon, hydrogen, silicon, aluminum, fluorine, chlorine and oxygen. This reaction ion etching (RIE) residue is conductive enough to cause shorts between metal lines. In addition, RIE residue may also cause adhesion problems between the metal lines and an overlaying insulator. The RIE residue on metal lines may additionally cause corrosion of the semiconductor sample. Furthermore, the RIE residue on polysilicon lines or oxide vias also cause yield loss problems.

These considerations have resulted in a considerable degree of activity in developing a chemically safe and easy method of removing RIE residue from a semiconductor sample. To this end U.S. Pat. No. 5,976,264 has proposed the removal of fluorine or fluorine residue by liquid carbon dioxide. A similar method is proposed in U.S. Pat. No. 5,908,510. This method includes the alternative utilization of a cryogenic aerosol. However, these methods have been found to swell polymeric constituents present on the semiconductor device. U.S. Pat. No. 5,738,082 also suggests the cleaning of silicon wafers with liquid carbon dioxide. The '082 patent suggests the inclusion of a surfactant. This patent, however, does not address the removal of RIE residue.

To sum up the state of the art, the use of supercritical fluids have been advanced for removing RIE residues but this proposal has met with only limited success. This is so insofar as polymeric residues result from a complex structure of carbon to fluorine and carbon to oxygen bonds. This complex polymeric structure bears a strong resemblance to polytetrafluoroethylene. Although Kirby et al., Chemical Rev., 99, 565–602 (1999) discloses that polytetrafluoroethylene is somewhat soluble in liquid carbon dioxide, the mere utilization of liquid or supercritical carbon dioxide has been found to be insufficient to remove RIE residue. Thus, it is apparent to those skilled in the art that more than liquid or supercritical carbon dioxide alone is required to completely remove RIE residue from precision surfaces.

BRIEF SUMMARY OF THE INVENTION

It has now been discovered that a composition which includes liquid or supercritical carbon dioxide removes RIE residue. That composition, which includes liquid or supercritical carbon dioxide, also incorporates a source of fluoride ions to form a composition which is able to remove the complex polymeric materials that form on precision surfaces during etching procedures including reaction ion etching.

In accordance with the present invention a process is provided for the removal of etching residue from a precision surface by contacting that surface with a composition which includes liquid or supercritical carbon dioxide and fluoride generating species.

BRIEF DESCRIPTION OF THE DRAWINGS

The present invention may be better understood by reference to the accompanying drawing of which.

DETAILED DESCRIPTION

Figure 1:
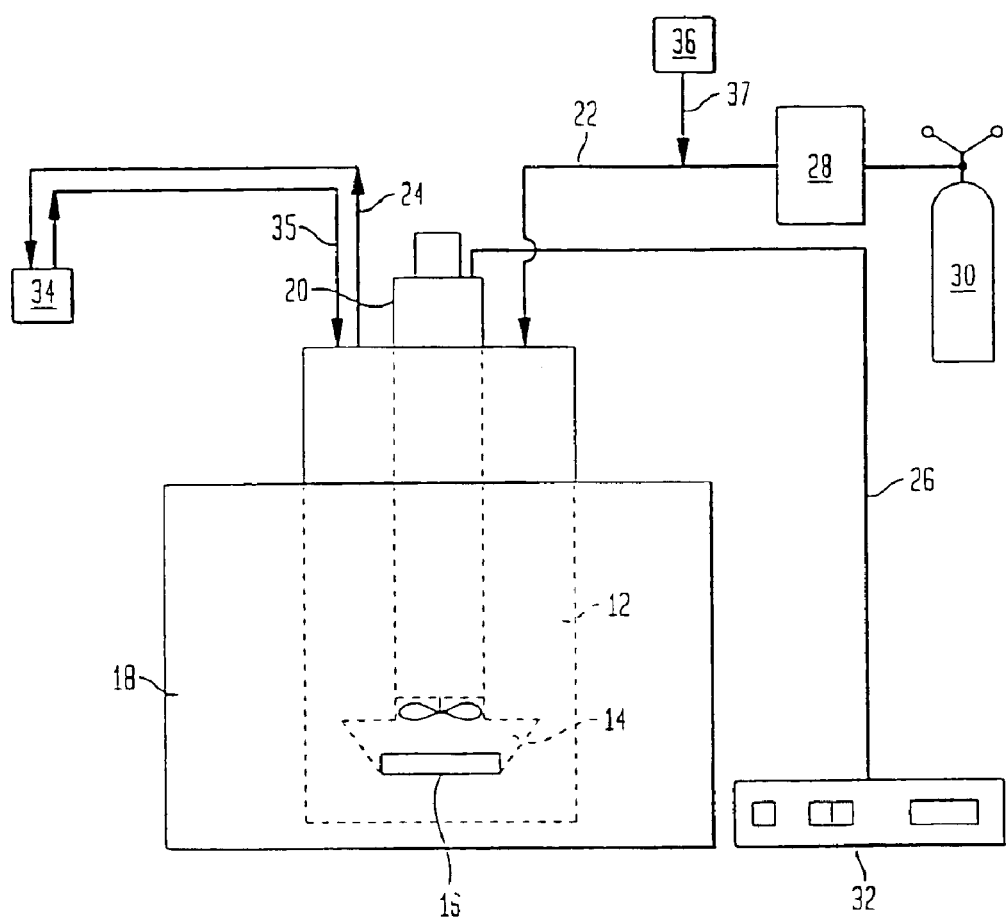
FIG. 1 is schematic representation of an apparatus employed in a process of removing residue from an etched precision surface.

Precision surfaces are etched using techniques well known in to those skilled in the art. Suitable techniques for etching a precision surface include, but are not limited to, reactive ion etching (RIE), ion beam etching (IBE), plasma etching, laser ablation and the like. Of these etching techniques, RIE is particularly preferred for use in the present invention. Typically, RIE is carried out using gases containing halogens, preferably chlorine or fluorine.

The term "precision surface," as used herein, denotes a material which contains a surface that has vias, cavities, trenches and/or channels incorporated therein. Precision surfaces that may be employed in the present invention include, but are not limited to, semiconductor samples, metals such as Al, Si, W, Ti, Ta, Pt, Pd, Rr, Cr, Cu and Ag, polymers such as polyimides, polyamides and the like, and insulators. Of these precision surfaces semiconductor samples are particularly preferred for employment in the present invention. Semiconductor samples that can be used in the present invention include semiconductor wafers, semiconductor chips, ceramic substrates, patterned film structures and the like.

It should be furthermore appreciated that residue on a precision surface after etching includes one or more of the following elements: carbon, hydrogen, silicon, aluminum, titanium, tantalum, tungsten, platinum, palladium, iridium, chromium, fluorine, chlorine and oxygen.

Although the following description emphasizes RIE residue on semiconductor samples, it is emphasized that the present invention is equally applicable to other types of precision surfaces which may be etched by any of the aforementioned etching techniques. Thus, the description provided hereinbelow also applies to an IBE insulator, a laser ablated polymer and the like.

A schematic representation of the apparatus employed in the present invention is depicted in FIG. 1. The apparatus includes a process chamber 12 having an etch residue removal zone 14 wherein a precision surface device 16, for example, a semiconductor device, is placed. The process chamber 12 is surrounded by heated jacket 18 and contains, optionally, a stirring mechanism 20. Additionally, the process chamber contains inlet line 22, outduct 24 and thermocouple 26. The inlet line 22 contains a high pressure pump system 28 which is connected to a carbon dioxide source 30 for supplying liquid or supercritical carbon dioxide to process chamber 12. Thermocouple 26 is also connected to heat controller 32 which is utilized for controlling and monitoring the temperature in the etch residue removal zone 14. A reservoir 34 may also be provided for collecting and/or purifying liquid or supercritical carbon dioxide that may exit process chamber 12 through outduct 24. This carbon dioxide may then be recycled into process chamber 12 through duct 35 to form a closed reactor system.

The carbon dioxide source 30 contains pressurized carbon dioxide. Indeed, as shown in FIG. 1, the carbon dioxide is further pressurized by a high pressure pump 28. Typically, the carbon dioxide fluid is prepressurized to a pressure in the range of between about 1,000 psi and about 6,000 psi. More preferably, the carbon dioxide is prepressurized to a pressure in the range of between about 2,000 psi and about 5,000 psi. Even more preferably, the carbon dioxide is pressurized to a pressure of about 3,000 psi before entering process chamber 12 through inlet line 22.

The processing step of etch residue removal is conducted in accordance with the thermodynamic conditions extant in processing chamber 12. Thus, the process occurs at a pressure in the range of between about 1,000 psi and about 6,000 psi, more preferably, between about 2,000 psi and about 5,000 psi and, most preferably, a pressure of about 3,000 psi and a temperature in the range of between about 40° C. and about 100° C., more preferably, a temperature in the range of between about 40° C. and about 70° C. and, most preferably, a temperature of about 40° C.

To ensure effective removal of etch residue from the semiconductor device 16, the device 16 is exposed to a liquid or supercritical carbon dioxide composition, under the above thermodynamic conditions, for about two minutes to about two hours. More preferably, the time period of exposure of the semiconductor sample to the liquid or supercritical carbon dioxide composition, under the above-identified conditions, is about two minutes.

Another optional feature of the process of the present invention, which helps insure uniform exposure to the carbon dioxide composition, is providing stirring of the liquid or supercritical carbon dioxide. This is depicted in the apparatus, wherein stirring is provided, by stirring mechanism 20. In those cases where this optional feature is provided, stirring occurs at a rate of between about 500 rpm and about 2,500 rpm, preferably, about 1,000 rpm.

The process of the present invention is distinguished from prior art processes by the utilization of a composition which includes a fluoride-generating species. That is, the present invention encompasses a composition which includes liquid or supercritical carbon dioxide in combination with a species which generates fluoride ions. It is emphasized that although the species must include fluorine, that is not enough. The species must generate fluoride ions insofar as it is this chemical property that represents an improvement over prior art teachings. Stated differently, the fact that a composition may be provided which includes a fluorine-containing compound is not enough to read on the fluoride generating species of the present invention. The species of the composition of the present invention must generate fluoride ions.

Although the invention is not limited to any theory explaining its operation, it is believed that residue formed on etched precision surfaces, such as RIE precision surfaces, is a polymeric type deposit which resembles polyfluoroethylene. A polyfluoroethylene-like residue is highly insoluble in most solvents including carbon dioxide. Thus, in order to break the interfacial bond between the polyfluoroethylene-type deposit and silicon, the usual substrate upon which a precision surface is formed, it is postulated that fluoride ions, generated by a fluoride-generating species, is essential to at least slightly etch the surface to break the bond between the polyfluoroethylene-like deposit and the silicon substrate, so that the etch residue can be effectively removed.

A first example of a fluoride generating species is a fluorine-containing acid, such as hydrogen fluoride, fluorosulfonic acid and perfluorosulfonic acid.

A second fluoride-generating species is a fluorine-containing acid amine adduct. Examples of such an adduct is pyridine:hydrogen fluoride, amine:hydrogen fluoride and alkylamine:hydrogen fluoride.

Amine fluorides are a third fluoride generating species. Thus, an alkylamine fluoride, for example, methylaminofluoride, is preferred for use in the composition employed in the process of the present invention.

A fourth fluoride generating species is a quaternary amine fluoride, such as a tetraalkylammonium fluoride, e.g. tetramethylammonium fluoride, and a perfluoroalkylammonium fluoride.

Yet a fifth class of fluoride generating species are the perfluoroalkylsulfonyl fluorides such as trifluoroalkylsulfonyl fluoride and perfluoroalkylsulfonyl fluoride.

A sixth class of fluoride-generating sources are the alkylsulfonyl fluorides such as octylsulfonyl fluoride.

A seventh class of fluoride-generating species are arylsulfonyl fluorides. Benzylsulfonyl fluoride is an example of this species.

An eighth and final class of fluoride generating species, within the scope of the composition employed in the process of the present invention, are onium salts containing fluorine. Examples of this final class of fluoride generating species are benzene diazonium fluoride and benzene diazonium tetrafluoroborate.

The fluorine generating species may be introduced into the etch residue removal zone 14 of process chamber 12 through a separate inlet or, as illustrated in FIG. 1, a fluoride-generating source may be provided from a source 36 which is introduced into the same inlet conduit, conduit 22, through which liquid or supercritical carbon dioxide is introduced therein, by means of conduit 37, which is in communication with conduit 22.

It is noted that the aforementioned fluoride-generating species may be a fluid or a solid. In the event that a solid is employed it is essential that the fluoride-generating species be provided as a solution or a dispersion.

In this regard it is emphasized that the composition employed in the process of the present invention may include additional components. Among these additional components are surfactants, which aid in permitting the residue removing composition to penetrate into vias, cavities, trenches and channels, as well as cosolvents, such as inert hydrocarbons, e.g. cyclohexane and xylene.

The above embodiments are given to illustrate the scope and spirit of the present invention. These embodiments will make apparent, to those skilled in the art, other embodiments and examples. These other embodiments and examples are within the contemplation of the present invention. Therefore the present invention should be limited only by the appended claims.

What is claimed is:

1. A process of cleaning a precision surface comprising contacting a reactive ion etched precision surface having vias, cavities, trenches or channels incorporated therein, said reactive ion etched precision surface containing reactive ion etch residue, with a composition which consists essentially of liquid or supercritical carbon dioxide and a fluoride-generating species until the reactive ion etch residue is removed from the precision surface.

2. A process in accordance with claim 1 wherein said fluoride-generating species is a fluorine-containing acid.

3. A process in accordance with claim 2 wherein said fluorine-containing acid is selected from the group consisting of hydrogen fluoride, fluorosulfonic acid and perfluorosulfonic acid.

4. A process in accordance with claim 1 wherein said fluoride-generating species is a fluorine-containing acid amine adduct.

5. A process in accordance with claim 4 wherein said fluorine-containing amine adduct is pyridine:hydrogen fluoride, amine:hydrogen fluoride or an alkylamine:hydrogen fluoride.

6. A process in accordance with claim 1 wherein said fluoride-generating species is an amine fluoride.

7. A process in accordance with claim 1 wherein said fluoride-generating species is a quaternary amine fluoride.

8. A process in accordance with claim 7 wherein said quaternary amine fluoride is selected from the group consisting of a tetraalkylammonium fluoride and a perfluoroalkylammonium fluoride.

9. A process in accordance with claim 1 wherein said fluoride-generating species is a perfluororalkylsulfonyl fluoride.

10. A process in accordance with claim 9 wherein said perfluororalkylsulfonyl fluoride is trifluoromethylsulfonyl fluoride or perfluorooctylsulfonyl fluoride.

11. A process in accordance with claim 1 wherein said fluoride-generating species is an alkylsulfonyl fluoride.

12. A process in accordance with claim 1 wherein said fluoride-generating species is an arylsulfonyl fluoride.

13. A process in accordance with claim 1 wherein said fluoride-generating species is an onium salt-containing fluorine.

14. A process in accordance with claim 13 wherein said onium salt containing fluorine is selected from the group consisting of benzene diazonium fluoride and benzene diazonium tetrafluoroborate.

15. A process in accordance with claim 1 wherein said composition further consists of a component selected from the group consisting of a surfactant, a co-solvent and mixtures thereof.

16. A process in accordance with claim 1 wherein said contact between said reactive ion etched precision surface and said composition occurs at a pressure in the range of between about 1,000 psi and about 6,000 psi and at a temperature in the range of between about 40° C. and about 100° C.

17. A process in accordance with claim 1 wherein said reactive ion etched precision surface is provided by a semiconductor sample, a metal selected from the group consisting of aluminum, silicon, tungsten, titanium, tantalum, platinum, palladium, iridium, chromium, copper and silver, a polymer selected from the group consisting of polyimides and polyamides or insulators.

18. A process in accordance with claim 17 wherein said reactive ion etched precision surface is provided by a semiconductor sample.

19. A process in accordance with claim 18 wherein said semiconductor sample is selected from the group consisting of a semiconductor wafer, a semiconductor chip, a ceramic substrate and a patterned film structure.

20. A process in accordance with claim 19 wherein said semiconductor sample is a semiconductor wafer.

* * * * *